United States Patent
Heiries et al.

(10) Patent No.: US 10,267,861 B2
(45) Date of Patent: Apr. 23, 2019

(54) AUTOMATIC METHOD FOR ESTIMATING THE STATE OF CHARGE OF A BATTERY CELL

(71) Applicant: RENAULT S.A.S., Boulogne-Billancourt (FR)

(72) Inventors: Vincent Heiries, Saint-Jean-de-Moirans (FR); Sylvain Leirens, Grenoble (FR)

(73) Assignee: Renault S.A.S., Boulogne-Billancourt (FR)

( * ) Notice: Subject to any disclaimer, the term of this patent is extended or adjusted under 35 U.S.C. 154(b) by 25 days.

(21) Appl. No.: 15/531,547

(22) PCT Filed: Nov. 26, 2015

(86) PCT No.: PCT/FR2015/053239
§ 371 (c)(1),
(2) Date: May 30, 2017

(87) PCT Pub. No.: WO2016/083753
PCT Pub. Date: Jun. 2, 2016

(65) Prior Publication Data
US 2017/0356964 A1 Dec. 14, 2017

(30) Foreign Application Priority Data
Nov. 28, 2014 (FR) .................................. 14 61615

(51) Int. Cl.
*G01R 31/36* (2006.01)
(52) U.S. Cl.
CPC ..... *G01R 31/3624* (2013.01); *G01R 31/3648* (2013.01); *G01R 31/3651* (2013.01)
(58) Field of Classification Search
CPC ............ G01R 31/3648; G01R 31/3651; G01R 31/3624
(Continued)

(56) References Cited

U.S. PATENT DOCUMENTS 5,570,087 A * 10/1996 Lemelson .............. G07C 5/085
340/439
5,714,866 A * 2/1998 S et al. ................. H01M 10/46
320/137
(Continued)

FOREIGN PATENT DOCUMENTS

FR 2971854 8/2012
FR 2975190 11/2012
(Continued)

OTHER PUBLICATIONS

Plett, Gregory L., "Extended Kalman Filtering for Battery Management Systems of LiPB-based HEV Battery Packs Part 3. State and Parameter Estimation" Journal of Power Sources, 134:277-292 (2004).

(Continued)

*Primary Examiner* — Sun Lin
(74) *Attorney, Agent, or Firm* — Occhiuti & Rohlicek LLP

(57) ABSTRACT

An automatic estimation procedure for estimating a battery's state-of-charge includes predicting the state-of-charge using a state model that includes a state-transition matrix. An observation model then uses an observability matrix in connection with predicting a measured value of a parameter. State noise, the covariance of which is characterized by a state-noise covariance matrix contaminates this prediction. Similarly, measurement noise, the covariance of which is characterized by a measurement covariance matrix, contaminates this prediction. The values of these covariance matrices are then adjusted during the estimation procedure.

8 Claims, 4 Drawing Sheets

(58) Field of Classification Search
USPC .......................................................... 320/132
See application file for complete search history.

(56) References Cited

U.S. PATENT DOCUMENTS

| | | | | |
|---|---|---|---|---|
| 6,329,793 | B1* | 12/2001 | Bertness et al. ... | G01R 31/3631 320/132 |
| 6,441,586 | B1 | 8/2002 | Tate, Jr. et al. | |
| 7,969,120 | B2 | 6/2011 | Plett | |
| 2003/0211372 | A1* | 11/2003 | Adams et al. .... | H01M 8/04238 320/101 |
| 2005/0023056 | A1* | 2/2005 | Harrup et al. ....... | B60K 7/0007 180/65.6 |
| 2005/0046388 | A1 | 3/2005 | Tate, Jr. et al. | |
| 2013/0006454 | A1 | 1/2013 | Li et al. | |
| 2015/0369873 | A1* | 12/2015 | Nakao et al. ...... | G01R 31/3606 702/63 |
| 2017/0269164 | A1* | 9/2017 | Heiries et al. ..... | G01R 31/3648 |
| 2017/0276734 | A1* | 9/2017 | Heiries et al. ..... | G01R 31/3648 |

FOREIGN PATENT DOCUMENTS

WO WO 2006/057468 6/2006
WO WO 2013/167833 11/2013

OTHER PUBLICATIONS

Plett, Gregory L., "Extended Kalman Filtering for Battery Management Systems of LiPB-based HEV Battery Packs Part 1. Background" Journal of Power Sources, 134:252-261 (2004).

Plett, Gregory L., "Extended Kalman Filtering for Battery Management Systems of LiPB-based HEV Battery Packs Part 2. Modeling and Identification" Journal of Power Sources, 134: 262-276 (2004).

Mehra, R.K: "On the identification of variances and adaptative Kalman Filtering", Automatic Control, IEEE Transaction on, vol. 15, No. 2, pp. 175-184, Apr. 1970.

Y. Bar-Shalom, et al.: "Estimation with Applications to Tracking and Navigation, Theory Algorithms and Software", Wiley Interscience, 2001.

* cited by examiner $$62 \longrightarrow x_{k+1} = \begin{bmatrix} SOC_{k+1} \\ V_{D,k+1} \end{bmatrix} = \begin{bmatrix} 1 & 0 \\ 0 & 1 - \frac{T_e}{R_D \cdot C_D} \end{bmatrix} \cdot \begin{bmatrix} SOC_k \\ V_{D,k} \end{bmatrix} + \begin{bmatrix} -\frac{T_e}{C_{n,k3}} \\ \frac{T_e}{C_D} \end{bmatrix} \cdot i_k + w_k$$

Fig. 4

$$64 \longrightarrow y_k = OCV(SOC_k) - V_{D,k} - RO_{k2} i_k + v_k$$

Fig. 5

$$70 \longrightarrow RO_{k2+1} = RO_{k2} + w_{2,k2}$$

Fig. 6

$$72 \longrightarrow u_{k2} = \sum_{m=k-N}^{k} [OCV(SOC_m) - V_{D,m} - RO_{k2} \cdot i_m] + v_{2,k2}$$

Fig. 7

$$74 \longrightarrow C_{n,k3+1} = C_{n,k3} + v_{3,k3}$$

Fig. 8

$$76 \longrightarrow z_{k3} = \frac{(SOC_k - SOC_{k-N})}{N T_e} \cdot 3600 \cdot C_{n,k3} + v_{3,k3}$$

Fig. 9

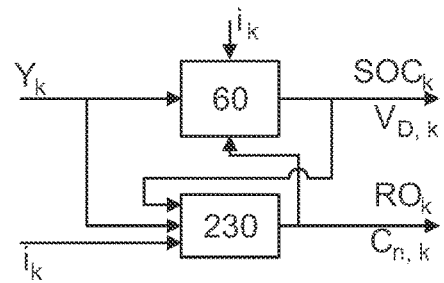

Fig. 14

$$232 \longrightarrow x_{k+1} = \begin{bmatrix} RO_{k4+1} \\ C_{n,\,k4+1} \end{bmatrix} = \begin{bmatrix} 1 & 0 \\ 0 & 1 \end{bmatrix} \begin{bmatrix} RO_{k4} \\ C_{n,\,k4} \end{bmatrix} + w_{d,\,k4}$$

Fig. 15

$$234 \longrightarrow \begin{bmatrix} u_{k4} \\ z_{k4} \end{bmatrix} = \begin{bmatrix} \sum_{m=k-N}^{k} [OCV(SOC_m) - V_{D,\,m} - RO_{k4} \cdot i_m] \\ \dfrac{(SOC_k - SOC_{k-N})}{N\,Te} \cdot 3600 \cdot C_{n,\,k4} \end{bmatrix} + v_{d,\,k4}$$

Fig. 16

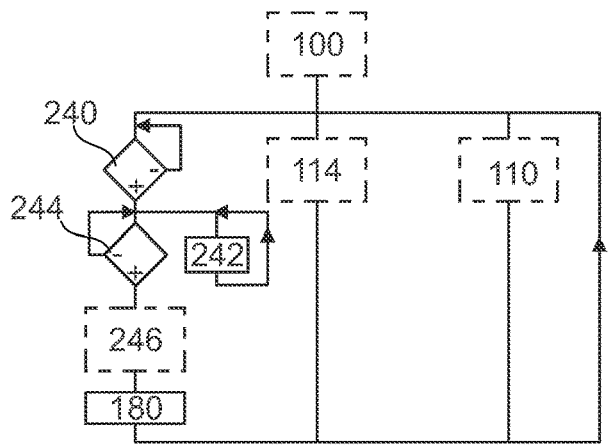

Fig. 17

$$250 \longrightarrow x_{k+1} = \begin{bmatrix} RO_{k4+1} \\ C_{n,\,k4+1} \end{bmatrix} = \begin{bmatrix} \left(\alpha + \dfrac{\beta N_k^C}{N_{EOL}^C}\right) & 0 \\ 0 & \left(1 + \dfrac{\gamma \cdot N_k^C}{N_{EOL}^C}\right) \end{bmatrix} \cdot \begin{bmatrix} RO_k \\ C_{n,\,k} \end{bmatrix} + w_{d,\,k}^a$$

Fig. 18

AUTOMATIC METHOD FOR ESTIMATING THE STATE OF CHARGE OF A BATTERY CELL

RELATED APPLICATIONS

This application is the national stage of PCT/FR/2015/053239, which was filed on Nov. 26, 2015, which claims the benefit of the Nov. 28, 2014 priority date of French application FR1461615, the contents of which are herein incorporated by reference.

FIELD OF INVENTION

The invention relates to battery management, and in particular, to estimating a battery's state-of-charge.

BACKGROUND

As a battery becomes older, it becomes less able to hold charge. It is therefore useful to be able to determine the state-of-charge of a battery.

A known method for estimating the state of charge of a cell of a battery can be found in L. Plett, et al.: "*Extended Kalman filtering for battery management systems of LiPB-based HEV battery packs*", Journal of Power Sources, 2004, page 252-292. This article will be referred to herein as "Plett 2004."

Known methods of such estimation involve matrices that represent state noise and measurement noise. In practice, it is difficult to set these matrices. This is particularly true for the state noise matrix since it is difficult to quantify the modelling error a priori.

SUMMARY

In one aspect of the invention, the covariance matrices for state noise and measurement noise, $Q_k$ and $R_k$ are set on the basis of known matrices $F_k$ and $H_k$ of the state and observation models and an integer $N_0$. In the above method, the user only has to choose a value for the integer $N_0$ instead of having to set each of the coefficients of the two covariance matrices $Q_k$ and $R_k$. This considerably simplifies setting the two covariance matrices.

Some practices of the invention include repeating the setting of the covariance matrices each time one of the known matrices $F_k$ and $H_k$ is modified. This tends to improve the estimate of the cell's state-of-charge.

In another aspect, the invention features a tangible and non-transitory data storage medium that has, encoded thereon, instructions for executing the above automatic estimating method when these instructions are executed by an electronic processor.

In another aspect, the invention includes a battery-management system for managing a battery according to the foregoing methods. Another aspect of the invention includes a motor vehicle that includes a battery-management system for managing a battery according to the foregoing methods.

BRIEF DESCRIPTION OF THE DRAWINGS

The invention will be better understood upon perusal of the following description, given solely as a nonlimiting example, and referring to the drawings, in which:

FIGS. 4 to 9 represent equations of different state models and observation models used by the estimators of FIG. 3;

FIG. 14 is a schematic illustration of another arrangement of estimators used to estimate the cell's state-of-charge of the battery of the vehicle of FIG. 1;

FIGS. 15 and 16 represent, respectively, a state model and an observation model used by the estimators of FIG. 14;

FIG. 17 is a flow chart of a method for estimating the cell's state-of-charge with the aid of the estimators of FIG. 14;

FIG. 18 is an illustration of another possible state model for predicting the internal resistance and capacitance of a cell of a battery.

In these figures, the same references are used to denote the same elements. In the remainder of this description, characteristics and functions well known to the person skilled in the art are not described in detail.

DETAILED DESCRIPTION

Figure 1:
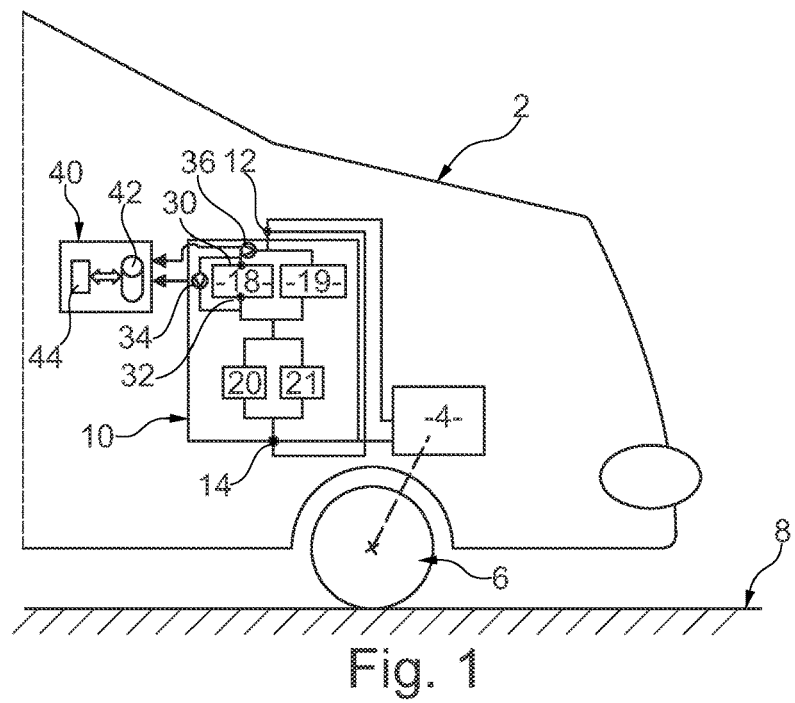
FIG. 1 is a partial schematic illustration of an automobile outfitted with a battery.

FIG. 1 shows an electric vehicle 2 having an electric motor 4 that causes wheels 6 to rotate, thus propelling the vehicle 2 along a roadway 8.

The battery 10 comprises first and second battery terminals 12, 14 for electrical connection and several electric cells electrically connected between the battery terminals 12, 14. The battery terminals 12, 14 connect to the electric motor 4.

The battery cells are grouped into several stages. These stages connect in series between the first and second terminals 12, 14. Only two such stages are shown for simplicity. The first stage comprises first and second cells 18, 19; the second stage comprises second and third cells 20, 21. Each stage comprises several branches connected in parallel. Each branch of a stage comprises one electric cell or several electric cells in series. In the illustrated embodiment, the first stage comprises two branches, with each branch having a single electric cell. The second stage is structurally identical to the first stage in the example shown in FIG. 1. Except for minor manufacturing tolerances, all battery cells are structurally identical. Accordingly, the estimation method is discussed only for the first cell 18. The ordinal adjective "first" is therefore omitted for brevity.

The cell's first and second electrical connection terminals 30, 32 connect it electrically to the other cells and, ultimately, to the battery's terminals 12, 14. The cell 18 is also fixed mechanically, with no degree of freedom, to the battery's other cells to form a pack of cells.

The cell 18 receives electrical energy while it is being charged and loses electrical energy while it is being discharged, for example when it is powering the motor 4. The complete discharging of a cell followed by its complete recharging constitutes what is known as a charging/discharging cycle, or simply the "cycle of a cell." Although the cell can be any type, the cells described in this embodiment are those used in a lithium-ion polymer battery.

A cell 18 is characterized by its initial capacitance $C_n^{ini}$, its initial internal resistance $RO^{ini}$, its maximum current $I_{max}$, its maximum voltage $U_{max}$, its minimum voltage $U_{min}$, and a function $OCV(SOC_k)$. The initial capacitance $C_n^{ini}$ is the capacitance of the cell 18 when it is brand new. The capacitance of a cell governs the maximum quantity of electric energy that can be stored in that cell, which is usually expressed in ampere-hours. As the cell 18 sustains charging and discharging cycles, it ages. This decreases its capacitance. Throughout this disclosure, the capacitance of the $n^{th}$ cell 18 at time k shall be denoted as $C_{n,k}$.

A cell's initial internal resistance $RO^{ini}$ is the value of the internal resistance of the cell 18 when it is brand new, and before it has had time to age. A cell's internal resistance is a physical quantity that is found in most circuit models of an electrical cell. As a cell ages, its internal resistance tends to increase. Throughout this disclosure, the internal resistance of the cell 18 at time k shall be denoted as $RO_k$.

The maximum current $I_{max}$ is the maximum current that can be delivered by the cell 18 without the cell becoming damaged.

The maximum voltage $U_{max}$ is the maximum voltage that can be present constantly between the cell's first and second terminals 30, 32 without damaging the cell. The minimum voltage $U_{min}$ is the minimum voltage between the cell's first and second terminals 30, 32 when the cell 18 is completely discharged.

Throughout the discussion that follows, the values of $I_{max}$, $U_{max}$, $U_{min}$ are regarded as constant physical quantities that do not vary over time.

$OCV(SOC_k)$ is a predetermined function that returns the no-load voltage of the cell 18 as a function of its state-of-charge $SOC_k$. The no-load voltage is the voltage measurable between the cell's first and second terminals 30, 32 after the cell 18 has been electrically insulated from any electric load for two hours.

The cell's state-of-charge at time k is denoted $SOC_k$. It is equal to 100% when the quantity of electric energy stored in the cell 18 is equal to whatever its capacitance $C_{n,k}$ permits. It is equal to 0% when the quantity of electric energy stored in the cell 18 is zero, that is, when no electric energy can be extracted from the cell 18 to energize an electric load.

The parameters $C_n^{ini}$, $RO^{ini}$, $I_{max}$, $U_{max}$, $U_{min}$ and the function $OCV(SOC_k)$ are known parameters of the cell. They are either provided by the cell's manufacturer or obtained by carrying out measurement son the cell.

The battery 10 also includes, for each cell, a voltmeter 34 and an ammeter 36. The voltmeter 34 measures the voltage between the cell's first and second terminals 30, 32. The ammeter measures the cell's charging or discharging current. To simplify FIG. 1, only one voltmeter 34 and one ammeter 36 of the cell 18 are shown.

Unlike the different parameters of the cell 18 introduced above, the cell's state-of-charge $SOC_k$ is not measurable. Thus, it needs to be estimated. The vehicle 2 thus also includes a battery-management system 40 carries out this function.

The battery-management system 40 determines the battery's state-of-charge and also its state-of-health. To determine the state-of-charge and this state-of-health, the battery-management system 40 estimates the state-of-charge and the state-of-health of each cell of the battery 10. A cell's state-of-health at time k, referred to herein as "SOHk," represents how much that cell has aged. A suitable metric for SOHk is the ratio $C_{n,k}/C_n^{ini}$. To calculate the cell's state-of-health, the battery-management system 40 must therefore also estimate its capacitance $C_{n,k}$ at the present time k.

To perform these various estimates, the battery-management system 40 connects to each voltmeter and each ammeter of the battery 10. This permits the battery-management system 40 to acquire measurements of voltage and current associated with each cell.

As shown in FIG. 1, the battery-management system 40 comprises a memory 42 and a programmable electronic computer 44, that is able to execute instructions recorded in the memory 42. For this purpose, the memory 42 contains the necessary instructions for the execution of the methods shown in FIGS. 10 to 12 and/or FIG. 17. The memory 42 also contains the initial values of the different parameters needed to execute these methods.

Figure 2:
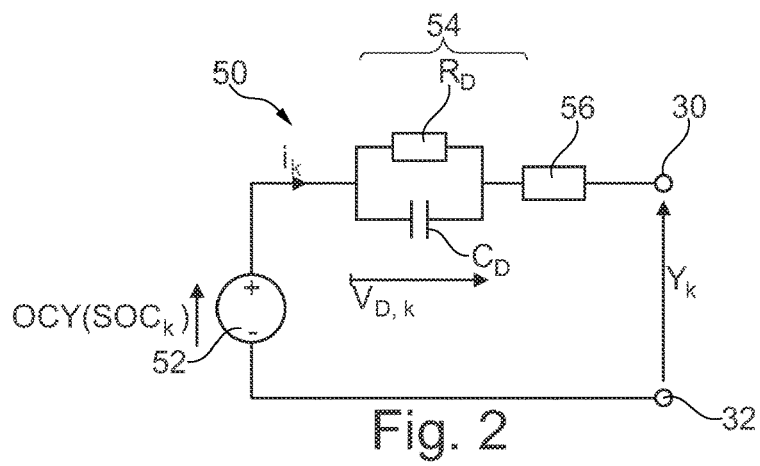
FIG. 2 is a schematic illustration of a circuit model of a cell of the battery shown in FIG. 1.

FIG. 2 represents a circuit model 50 of the cell 18. This model is known as a "first-order Thévenin model" or "lumped parameter model." It comprises, connected in succession in series starting from the cell's second terminal 32 and ending at the cell's first terminal 30: a generator 52 of no-load voltage $OCV(SOC_k)$, a parallel RC circuit 54, and an internal resistance 56 referred to hereinafter, at time k, "internal resistance $RO_k$."

The parallel RC circuit 54 comprises a capacitor $C_D$ connected in parallel to a resistor of value $R_D$. In the discussion that follows, these values are presumed to be known and constant. The voltage at time k across the terminals of the parallel RC circuit 54 is denoted as $V_{D,k}$. The value at time k of the voltage across the cell's first and second terminals 30, 32 is denoted as $y_k$ and the charging or discharging current of the cell 18, at the same time, is denoted as ik. These will be referred to as "measured voltage" and "measured current."

Figure 3:
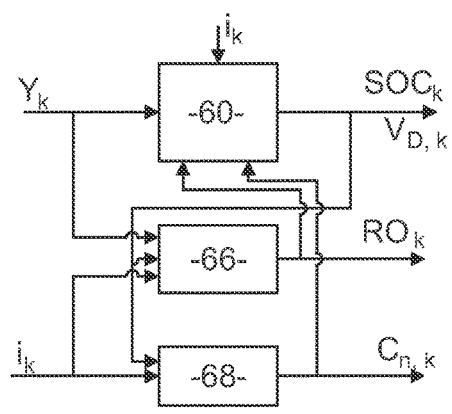
FIG. 3 is a schematic illustration of an arrangement of estimators used to estimate the cell's state-of-charge in the battery of the vehicle of FIG. 1.

FIG. 3 represents an arrangement of first, second, and third estimators 60, 66, 68 implemented in the battery-management system 40 to estimate the cell's state-of-charge and its state-of-health. Each estimator 60, 66, 68 is implemented as digital circuitry that has been configured to carry out a particular estimation algorithm. This is conveniently carried out by presenting a sequence of bit patterns stored in the memory 42 in sequence to the computer 44 to cause digital circuitry within the computer 44 to be reconfigured so that the computer 44 effectively becomes a new machine that carries out the relevant estimation. Although a computer represents an effective choice, an application-specific integrated circuit can also be used.

The first estimator 60 estimates the state-of-charge $SOC_k$ and the voltage $V_{D,k}$ based on the measured voltage $y_k$ and the measured current ik. The first estimator 60 is implemented in the form of a Kalman filter. It thus uses a first state model 62, shown in FIG. 4, and a first observation model 64, shown in FIG. 5.

In FIGS. 4 and 5, the equations that define these models are represented using the previously defined notation. The notations $RO_{k2}$ and $C_{n,k3}$ represent, respectively, the capacitance and the internal resistance of the cell 18 respectively, at times k2 and k3. These times k2 and k3 shall be defined afterwards. In the first state model 62, $x_k$ denotes the state vector $[SOC_k, V_{D,k}]^T$ at time k. In this description, the symbol "$^T$" denotes the vector transpose.

In the following, the temporal origin corresponds to the zero value of time k. In these conditions, the present time k is equal to $kT_e$, where $T_e$ is the sampling period for the measurements of the battery's ammeters 36 and voltmeters 34. Thus, $T_e$ is the period of time separating any two consecutive sampling times k and k−1 at which the battery-management system 40 receives a voltage and current measurement. The period $T_e$ is typically a constant between 0.1 seconds and 10 seconds. Preferably, the period $T_e$ is equal to 1±0.2 seconds or 1 second.

In the first state model 62, $w_k$ is a state noise vector. In the embodiment described herein, the noise $w_k$ is centered Gaussian white noise. This noise represents the uncertainty in the model used. The covariance matrix, at time k, of the noise $w_k$ is denoted as $Q_k$. It is defined by $Q_k=E(w_k \cdot w_k^T)$, where E( . . . ) is the mathematical expectation function. The first state model 62 is likewise written in the form $X_{k+1}=F_k x_k + B_k ik + w_k$, where $F_k$ is the state transition matrix at time k and $B_k$ is the control vector at time k. The first state model 62 thus allows prediction of the state-of-charge $SOC_{k+1}$ at time k+1 from the preceding state-of-charge $SOC_k$.

The first observation model 64 allows prediction of the measured voltage $y_k$ at time k from the state-of-charge $SOC_k$, the voltage $V_{D,k}$, and the measured current ik. In this model, vk is centered Gaussian white measurement noise. The covariance matrix of the noise vk at time k is denoted $R_k$ in the following. In the particular case described here, matrix $R_k$ is a matrix of a single column and a single row defined by the relation $R_k=E(vk \cdot vk^T)$. The noise vk is independent of the noise $w_k$ and of the initial state vector $x_0$.

The first observation model 64 is nonlinear since the function $OCV(SOC_k)$ is generally nonlinear. Because of this, the first estimator 60 implements the extended version of the Kalman filter. The extended version results in a linear observation model of the form $y_k = H_k x_k + RO_{k2} \cdot ik + vk$. This is arrived at by linearizing the first observation model 64 in the neighborhood of the vector $x_k$. Linearizing typically includes developing the first observation model 64 into a Taylor's series in the neighborhood of the vector $x_k$ and disregarding contributions of the derivatives starting with the second order. The matrix $H_k$ is thus equal to the first derivative of the function OCV in the neighborhood of the state-of-charge $SOC_k$. This linearization of the first observation model 64 is typically carried out for each new value of the state-of-charge $SOC_k$.

The first estimator 60 needs to know the cell's capacitance $C_{n,k3}$ and the internal resistance $RO_{k2}$ in order to be able to estimate the state-of-charge $SOC_{k+1}$. These both vary as the cell 18 ages. To take this aging into account, the second estimator 66 estimates the internal resistance $RO_{k2}$ from the measured value $y_{k2}$, from the measured current $ik_2$, and from the state-of-charge $SOC_{k2}$. The third estimator 68 estimates the capacitance $C_{n,k3}$ from the current $ik_3$ and the state-of-charge $SOC_{k3}$.

A cell's internal resistance and capacitance vary more slowly than does its state-of-charge. Thus, in order to limit the computational burden of estimating a cell's state-of-charge of the cell without significantly degrading the resulting estimate's accuracy, the battery-management system executes the second and third estimators 66, 68 less frequently than it does the first estimator 60. In what follows, the execution times of the second and third estimators 66 and 68 are denoted respectively as k2 and k3 in order to distinguish them from the times k. The set of times k2 and the set of times k3 are subsets of the set of times k. Thus, between two successive times k2 and k2−1 and between two successive times k3 and k3−1 there elapse several periods $T_e$ and several times k.

The second and third estimators 66, 68 are also each implemented in the form of a Kalman filter. The second estimator 66 uses a second state model 70, which is shown in FIG. 6, and a second observation model 72, which is shown in FIG. 7. In these models, the noises $w_{2,k2}$ and $v_{2,k2}$ are centered Gaussian white noises. The covariances of the noises $w_{2,k2}$ and $v_{2,k2}$ are denoted respectively as $Q_{2,k2}$ and $R_{2,k2}$. The second observation model 72 permits prediction of the value of a directly measurable physical quantity $u_{k2}$, which is the sum of the last N measured values $y_k$. It is defined by the following relation:
where N is a whole number greater $$u_{k2} = \sum_{m=k-N}^{k} y_k$$

than one that is counted as will be described below. In the above relation and in the second observation model 72, the time k is equal to the time k2.

The second observation model 72 considers not only the state-of-charge $SOC_k$, the voltage $V_{D,k}$, and the current ik measured at time k=k2, but also the N previous estimates of the first estimator 60 and the N previous measured currents between the times k2 and k2−1. Considering the intermediate measurements and estimates between the times k2 and k2−1 improves the estimate of the internal resistance $RO_{k2}$.

The third estimator 68 uses a third state model 74, shown in FIG. 8, and a third observation model 76, which is shown in FIG. 9. In the third state model 74 and the third observation model 76, the noises $w_{3,k3}$ and $v_{3,k3}$ represent centered Gaussian white noise. The covariances of the noises $w_{3,k3}$ and $v_{3,k3}$ are denoted respectively as $Q_{3,k3}$ and $R_{3,k3}$. The third observation model 76 is a linear model. This means that a simple Kalman filter can be used for the third estimator 68 instead of an extended Kalman filter.

The observation model 76 permits estimation of a directly measurable physical quantity $z_{k3}$. The physical quantity $z_{k3}$ is the sum of the last N measured currents, which is defined by the summation:

In the above summation and in the third observation model 76, the time k is equal to the time k3. This physical quantity $z_{k3}$ takes into account not only the current ik−1 measured at time k−1 preceding time k3 but also the previous N currents measured between the times k3 and k3−1. In the above summation, N is a whole number greater than one, which is counted as shall be described further below. It is not necessarily equal to the N introduced in the second observation model 72. Taking into account intermediate measurements and estimates between the times k3 and k3−1 improves the estimate for the capacitance $C_{n,k3}$.

Figure 10:
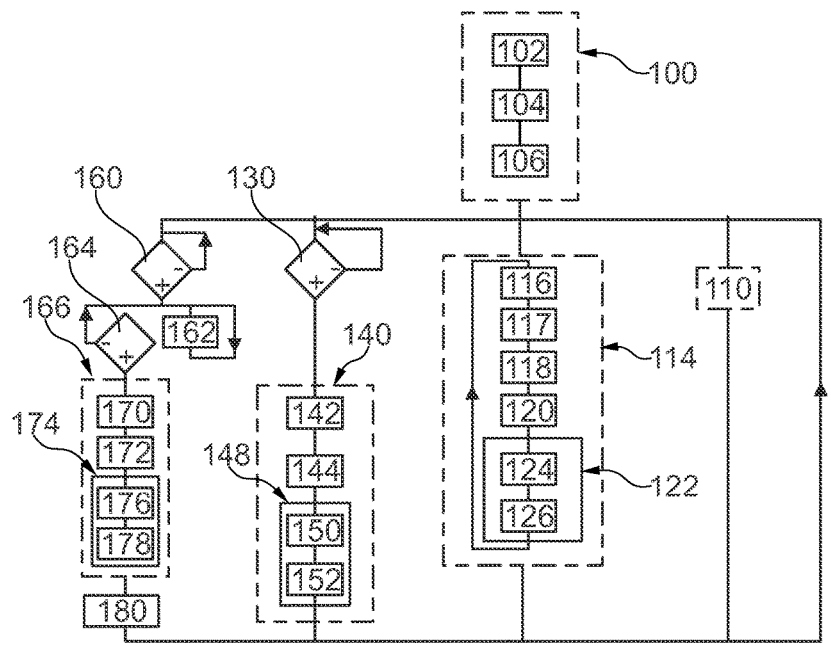
FIG. 10 is a flow chart of an estimation method used by the estimators of FIG. 3 to estimate the state-of-charge of the cell in FIG. 1.

FIG. 10 shows the overall procedure carried out by the first, second, and third estimators 60, 66, 68 as they cooperate to estimate a cell's state-of-charge.

The method starts with a covariance-adjustment phase 100 that includes adjusting the different covariance matrices that are needed to execute the first, second, and third estimators 60, 66, 68. The covariance adjustment phase 100 includes three steps, one corresponding to each of the three estimators 60, 66, 68.

In a first covariance-adjustment step 102, the covariance matrices $Q_k$ and $R_k$ of the first estimator 60 are automatically adjusted with the aid of the following relations: $Q_k=[N_0 G_{0,k}(N_0)]^{-1}$ and $R_k=I$, where $N_0$ is a predetermined whole number that is greater than 1, I is the identity matrix, and $G_{0,k}(N_0)$ is defined by:

$$G_{o,k}(N_o) = \sum_{i=0}^{N_o-1} (F_k^T)^i H_k^T H_k (F_k)^i$$

The whole number $N_0$ is generally chosen during the design of the battery-management system 40 and then is set once and for all. Generally, $N_0$ is less than 100. In some embodiments, $N_0$ is between 5 and 15. In other embodiments, $N_0$ is chosen equal to 10.

The use of the preceding relations considerably simplifies the adjustment of the matrices $Q_0$ and $R_0$ as well as the adjustment of the matrices $Q_k$ and $R_k$. In fact, the only parameter to be chosen is the value of the integer $N_0$.

During a second covariance-adjustment step 104, the covariances $Q_{2,0}$ and $R_{2,0}$ are also adjusted. In some embodiments, $Q_{2,0}$ is chosen to be equal to $[(\beta \cdot RO^{ini})/(3 \cdot N^C_{eol} \cdot N_S)]^2$, where $\beta$ is a constant chosen to be greater than or equal to 0.3 or 0.5 and preferably greater than 0.8 and generally less than three, $N^c_{eol}$ is the predicted number of charging and discharging cycles of the cell 18 before it reaches its end of life, and $N_S$ is the number of times that the internal resistance is estimated per charging and discharging cycle of the cell 18.

The constant $\beta$, expressed as a percentage divided by 100, represents the difference between the value of the initial internal resistance $RO^{ini}$ and its end of life value. Typically, $\beta$ is set by the user or measured experimentally. $N_c^{eol}$ is a number of cycles that can be measured experimentally or obtained from data provided by the cell's manufacturer. $N_S$ is set by the estimation method for estimating the state-of-charge as implemented by the computer 44. In this embodiment the internal resistance is estimated once per cycle. Consequently, $N_S=1$.

As an illustration, the covariance $R_{2,0}$ is chosen equal to $(2\varepsilon_m U_{max}/300)^2$, where $\varepsilon_m$ is the maximum error of the voltmeter 34 expressed as a percentage.

Afterwards, the covariances $Q_{2,k2}$ and $R_{2,k2}$ are considered to be constant and equal respectively to $Q_{2,0}$ and $R_{2,0}$.

Some embodiments feature a step 106 in which the covariances are adjusted. For example, the covariance $Q_{3,0}$ is set to be equal to $[\gamma \cdot C_n^{ini}/(3 \cdot N^C_{eol} \cdot N_S)]^2$, where $\gamma$, expressed as a percentage divided by 100, represents the difference between the initial capacitance $C_n^{ini}$ and the capacitance of the cell 18 at the end of life. The value of $\gamma$ is a constant chosen to be between 0.05 and 0.8, preferably between 0.05 and 0.3. In the embodiment described herein, $\gamma=0.2$.

In some embodiments, the covariance $R_{3,0}$ is chosen to be equal to $[2 \cdot \varepsilon_{im} \cdot I_{max}/300]^2$, where $\varepsilon_{im}$ is the maximum error of the ammeter 36 expressed in percentage.

Afterwards, the covariances $Q_{3,k3}$ and $R_{3,k3}$ are considered to be constant and equal respectively to $Q_{3,0}$ and $R_{3,0}$.

Once the covariance matrices have been adjusted, the estimation of the state-of-charge of the cell 18 can commence.

During a measurement phase 110, at each time k the voltmeter 34 and the ammeter 36 measure, respectively, the measured voltage $y_K$ and the measured current ik. The battery-management system 40 then immediately acquires these measurements and records them in the memory 42. The measurement phase 110 is repeated at each time k.

In parallel, the first estimator 60 executes an SOC-estimation phase 114 during which it estimates the cell's state-of-charge at time k.

The SOC-estimation phase 114 begins with an SOC-prediction step 116 during which the first estimator 60 calculates a state-of-charge prediction $S\hat{O}C_{k/k-1}$ and a voltage prediction $V_{D,k/k-1}$ to predict the cell's state-of-charge of the cell 18 and the voltage $V_D$ at the terminals of the parallel RC circuit 54 shown in FIG. 2 at time k.

As used herein, the index k/k−1 indicates that the prediction for time k considers only the measurements obtained between the times 0 and k−1. This is referred to as an "a priori" prediction. The index k/k indicates that the prediction considers all of the measurements done between the times 0 and k. This is referred to as an "a posteriori" prediction. The predictions $S\hat{O}C_{k/k-1}$ and $V_{D,k/k-1}$ are calculated with the help if the first state model 62 from the measured current $ik_{-1}$ and the capacitance $C_{n,k3}$. In the first state model 62, the state transition matrix $F_{k-1}$ is constant regardless of k and thus does not need to be reevaluated at each time k.

During a first covariance-predicting step 117, the first estimator 60 likewise calculates the prediction $P_{k/k-1}$ of a covariance matrix for the error in estimating the state vector $x_k$. In the embodiment described herein, the prediction is given by $P_{k/k-1}=F_{k-1}P_{k-1/k-1}F_{k-1}^T+Q_{k-1}$.

These various matrices $F_{k-1}$, $P_{k-1/k-1}$ and $Q_{k-1}$ have already been defined previously.

Then, during a linearizing step 118, the first estimator 60 constructs the matrix $H_k$ by linearizing the first observation model 64 around the predictions $S\hat{O}C_{k/k-1}$ and $V_{D,k/k-1}$.

During a second covariance-updating step 120, the covariance matrices $Q_k$ and $R_k$ are automatically updated. In the embodiment described herein, the second covariance-updating step 120 is identical to the first covariance-adjustment step 102, but with the further consideration of the matrix $H_k$ constructed during the linearizing step 118.

After having completed the second covariance-updating step 120, the first estimator 60 proceeds with an SOC-prediction correcting step 122. During the prediction-correction step 160, the first estimator 60 corrects the predictions $S\hat{O}C_{k/k-1}$ and $V_{D,k/k-1}$ based on a difference between the measured voltage $y_k$ and a predicted value of the voltage $\hat{y}_k$, the predicted value having been computed by the first observation model 64. This results in a prediction-discrepancy.

The SOC-prediction correcting step 122 includes first and second prediction-correction operations. The first prediction-correction operation includes calculating the prediction $\hat{y}_k$. The second prediction-correction operation 126 includes the predictions $S\hat{O}C_{k/k-1}$ and $V_{D,k/k-1}$ and the matrix $P_{k/k-1}$ to obtain the corrected predictions $S\hat{O}C_{k/k}$, $V_{D,k/k}$ and $P_{k/k}$.

During the first SOC-prediction correcting operation 124, the prediction $\hat{y}_k$ is calculated using the first observation model 64 with the state-of-charge being set equal to $S\hat{O}C_{k/k-1}$ and the value of the voltage $V_{D,k}$ being set equal to $V_{D,k/k-1}$. For convenience, it is useful to refer to the difference between the measured voltage $y_k$ and its predicted value $\hat{y}_k$ as the discrepancy, $E_k$.

There are many methods for correcting the a priori estimates $S\hat{O}C_{k/k-1}$ and $V_{D,k/k-1}$ based on the discrepancy $E_k$. For example, during the second SOC-prediction correcting operation 126, the estimates are corrected with the help of the Kalman gain $K_k$. The Kalman gain $K_k$ is given by $K_k=P_{k/k-1}H^T_k(H_kP_{k/k-1}H^T_k+R_k)^{-1}$. The a priori predictions are then corrected with the help of the following relation: $x_{k/k}=x_{k/k-1}+K_kE_k$.

The matrix $P_{k/k-1}$ is corrected with the help of the following relation: $P_{k/k}=P_{k/k-1}-K_kH_kP_{k/k-1}$.

The SOC-estimation phase 114 repeats at each time k when a new estimate of the state-of-charge of the cell 18 needs to be done. During each new iteration, the state vector $x_{k-1}$ is initialized with the values obtained during the preceding iteration of the SOC-estimation phase 114 for that cell 18.

In parallel, during a first comparison-step 130, the computer 44 compares each new measurement of the current ik to a predetermined current threshold $SH_i$. As long as the measured current ik falls short of this threshold $SH_i$, the execution of the second estimator 66 is inhibited. Conversely, once the measured current ik surpasses this threshold $SH_i$, the second estimator 66 is immediately executed. In many embodiments, the threshold $SH_i$ is greater than $I_{max}/2$. Preferably, it is greater than $0.8 \cdot I_{max}$ or even $0.9 \cdot I_{max}$.

The second estimator 66 executes a resistance-estimation phase 140 during which it estimates the internal resistance $RO_{k2}$ at time k2, where the time k2 is equal to the time k at which the measured current ik crosses the threshold $SH_i$. The resistance-estimation phase 140 includes a resistance-prediction step 142, a second covariance-predicting step 144, and a prediction-correction step 148.

During the resistance-prediction step 142, the second estimator 66 calculates the a priori prediction $R\hat{O}_{k/k-1}$ of the internal resistance from the second state model 70.

Next, during the second covariance-prediction step 144, the second estimator 66 calculates the prediction $P_{2,k2/k2-1}$ of the covariance matrix of the error of estimation for the internal resistance. For example, this prediction is calculated with the help of the relation: $P_{2,k2/k2-1} = P_{2,k2-1/k2-1} + Q_{2,0}$. It is apparent that the second observation model 72 is a linear function of the state variable. Thus, it is not necessary to linearize it in the neighborhood of the prediction $R\hat{O}_{k2/k2-1}$ to obtain the matrix $H_{2,k2}$. In this case, the matrix $H_{2,k2}$ is equal to $-N$.

During a resistance-prediction correction step 148, the second estimator 66 corrects the prediction $R\hat{O}_{k2/k2-1}$ as a function of the difference between the measured physical quantity $u_{k2}$ and a corresponding predicted physical quantity $\hat{u}_{k2}$. In this operation, N is a predetermined positive integer that, in some embodiments, is greater than ten, and in other embodiments, is greater than thirty. The second estimator 66 acquires the measured physical quantity $u_{k2}$ as the measured voltages $y_k$ are measured and acquired.

In particular, the resistance-prediction correction step 148 includes a first resistance-prediction-correction operation 150 and a second prediction-correction operation 152.

During the first resistance-prediction-correction operation 150, the computer 44 acquires the measured physical quantity $u_{k2}$ and calculates the predicted physical quantity $\hat{u}_{k2}$. The acquisition of the measured physical quantity $u_{k2}$ is done by adding up the last N measurements of the measured value $y_k$. The predicted physical quantity $\hat{u}_{k2}$ is calculated with the help of the second observation model 72. In this second observation model 72, the value $RO_{k2}$ is set to be equal to the previously calculated value $RO_{k2/k2-1}$.

Next, during the second prediction-correction operation 152, the second estimator 66 corrects the prediction $R\hat{O}_{k2/k2-1}$ as a function of the discrepancy $E_{k2}$. The discrepancy $E_{k2}$ is equal to the difference between the measured physical quantity $u_{k2}$ and the predicted physical quantity $\hat{u}_{k2}$.

In the embodiment described herein, the second resistance-prediction-correction operation 152 uses the same method as that implemented during the second SOC-prediction correcting operation 126. Thus, the second resistance-prediction-correction operation 152 is not described here in further detail. The new estimate $RO_{k2/k2}$ is then used during the following executions of the first estimator 60 in place of the previous estimate $RO_{k2-1/k2-1}$.

Triggering execution of the second estimator 66 only when the measured current ik is elevated improves the estimate of the internal resistance and does so with reduced computational load. In fact, a synergistic relationship arises because the measurement precision of the ammeter increases as the current ik increases.

Also in parallel with the measurement phase 110 and the SOC-estimation phase 114, the method involves a second comparison step 160 during which, at each time k, the state-of-charge estimate $SOC_k$ is compared to a predetermined upper threshold $SH_{soc}$. If the state-of-charge estimate $SOC_k$ falls below this threshold $SH_{soc}$, the method continues immediately with a first counting step 162 and a third comparison step 164. Otherwise, the second comparison step 160 is repeated at the next time k. In the embodiment described herein, the threshold $SH_{soc}$ lies between 90% and 100%.

During the first counting step 162, the computer 44 begins initializes a counter to be zero. It then increments the counter by 1 at each new measurement of the current ik since the start of the first counting step 162. Moreover, at each time k, the measured current ik and the state-of-charge estimate $SOC_k$ are recorded and associated with the time k in a database.

In parallel with the first counting step 162, during a third comparison step 164, the computer 44 compares each new state-of-charge estimate $SOC_k$ with a predetermined threshold $SL_{soc}$. As long as the state-of-charge estimate $SOC_k$ remains higher than the predetermined threshold $SL_{soc}$, the first counting step 162 repeats at the following time k. Otherwise, as soon as the state-of-charge estimate $SOC_k$ falls below the predetermined threshold $SL_{soc}$, the computer 44 immediately triggers execution of the third estimator 68 and stops incrementing the counter. Thus, as long as the state-of-charge estimate $SOC_k$ does not surpass the predetermined threshold $SL_{soc}$, execution of the third estimator 68 is inhibited. In the embodiment described herein, the threshold $SL_{soc}$ lies between 0% and 10%.

In those cases in which it executes, the third estimator 68 executes a capacitance-estimation phase 166 during which it estimates the capacitance $C_{n,k3}$ at time k3. Thus, the time k3 is equal to time k at which the execution of the third estimator 68 was finally triggered.

As was the case for the resistance-estimation phase 140, given that the third estimator 68 is not executed at each time k. The time k3−1 does not correspond to the time k−1. On the contrary, the times k3 and k3−1 are separated by an interval of time greater than or equal to $NT_e$ where N is the number counted during the first counting step 162.

The parameters of the Kalman filter of the third estimator 68 are initialized with the previous values of these parameters obtained at the end of the previous iteration at time k3−1 of the capacitance-estimation phase 166.

The capacitance-estimation phase 166 includes a capacitance-prediction step 170, a third covariance-matrix predicting step 172, and a capacitance-prediction correction step 174.

The capacitance-prediction step 170 includes calculating the prediction $C_{n,k3/k3-1}$ with the help of the third state model 74.

The third covariance-matrix predicting step 172 includes calculating a prediction $P_{3,k3/k3-1}$ of the covariance matrix for the estimation error associated with estimating the capacitance.

During the third covariance-matrix predicting step 172 and the capacitance-prediction correction step 174, the matrix of observability $H_{3,k3}$ is equal to $[(SOC_k - SOC_{k-N})] \cdot 3600/(NT_e)$, where N is the number of times k that have elapsed between the time when the estimated state-of-charge dropped below the threshold $SH_{soc}$ and the time when the estimated state-of-charge has dropped below the threshold $SL_{soc}$. The value N of is equal to the value counted during the first counting step 162.

The capacitance-prediction correction step 174 includes correcting the predictions $C_{n,k3/k3-1}$ and $P_{3,k3/k3-1}$. This involves first and second capacitance-prediction correction operations 176, 178.

The first capacitance-prediction correction operation 176 includes acquiring the measured physical quantity $z_{k3}$ and calculating the prediction $\hat{z}_{k3}$ of the quantity $z_{k3}$. The acquisition of the quantity $z_{k3}$ includes calculating the sum of the last N currents measured between the times k−1 and k−N. The prediction $\hat{z}_{k3}$ is obtained from the observation model 76.

During the second capacitance-prediction correction operation 178, the third estimator 68 corrects the prediction $C_{n,k3/k3-1}$ as a function of the difference between the measured quantity $z_{k3}$ and the predicted quantity $\hat{z}_{k3}$ in order to obtain the a posteriori estimate of the capacitance $C_{n,k3/k3}$. This correction is done for example as described during second SOC-prediction correcting operation 126.

Next, the capacitance $C_{n,k3/k3}$ is sent to the first estimator 60, which proceeds to use it to estimate the state-of-charge of the cell 18 at the times that follow.

Triggering execution of the third estimator 68 only after the cell 18 has already been, for the most part, discharged promotes improved estimation while also reducing the computational load associated with carrying out the estimation.

At the end of capacitance-estimation phase 166, during an SOH-calculating step 180, the computer calculates the state-of-health $SOH_{k3}$ at time k3 based on a capacitance ratio: $SOH_{k3}=C_{n,k3}/C_n^{ini}$.

Figures 11, 12:
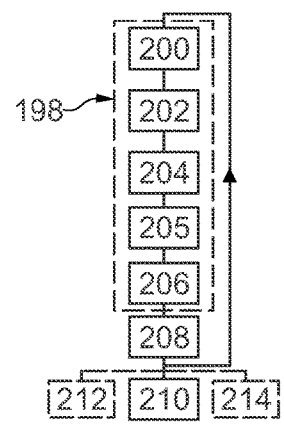
FIG. 11 is a flow chart of a method for determining of the state-of-charge of the battery of the vehicle of FIG. 1.
FIG. 12 is a flow chart of a method for scheduling the refresh times for estimates of the states-of-charge of different cells of a battery.

FIG. 11 represents a method of determining the battery's state-of-charge. At time k, the battery's state-of- is determined from the state-of-charge of each of its cells. For example, this is done in the following way. This includes a summation step 190, in which the computer 44 determines the state-of-charge of each stage of the battery by adding up the states-of-charge of each cell of that stage. This is follows by an SOC-assignment step 192 in which the battery's state-of-charge is set to that of the state having the smallest state-of-charge as determined during the summation step 190.

As illustrated by the method of FIG. 11, the determination of the battery's state-of-charge at each time k requires only an estimate of the state-of-charge for each of its cells at time k. A first solution thus includes executing in parallel, for each of the cells, the estimation method of FIG. 10 by executing the SOC-estimation phase 114 at each time k. However, this requires considerable computational load. To limit the required computational load without significantly degrading the estimate, it is possible to schedule the execution of the state-of-charge estimates as described in connection with the method shown FIG. 12.

The scheduling method of FIG. 12 is described in the simplified case of using only three priority levels: an elevated priority level, a medium priority level, and a low priority level. These priority levels govern how often a cell's state-of-charge will be estimated. By definition, a cell whose state-of-charge gives it an elevated priority level must have its state-of-charge re-estimated, or refreshed, at each time k and thus at a fundamental frequency $f_e$.

A cell whose state-of-charge gives it only a medium priority level only has to have its state-of-charge refreshed at frequency of a fraction of this fundamental frequency, for example, at a frequency $f_e/3$.

A cell whose state-of-charge gives it only a low priority level only has to have its state-of-charge refreshed at frequency of that is an even smaller fraction of this fundamental frequency, for example, at a frequency $f_e/10$.

In the illustrated example, there is a quota in place for elevated and medium priority cells. States-of-charge will thus only be refreshed for limited numbers of cells whose states of charge place them at either the high or medium priority levels.

To schedule the times at which the estimates of the state-of-charge of each of the cells need to be refreshed, the computer begins by assigning, during a priority-assignment step 198, a priority level to each cell.

The priority-assignment step 198 starts with a first prioritizing operation 200 during which the battery-management system 40 acquires the measured voltage $y_k$ across the terminals of each cell.

Next, during a second prioritizing operation 202, if the measured value $y_k$ is above an upper threshold $SH_y$, or, on the other hand, below a lower threshold $SL_y$, and if the quota for elevated priority has not yet been met, the computer 44 then assigns to this cell the elevated priority level.

The upper threshold $SH_y$ is greater than or equal to $0.9 \cdot U_{max}$ and, preferably, greater than $0.95 \cdot U_{max}$. The lower threshold $SL_y$, is greater than or equal to $U_{min}$ and less than $1.1 \cdot U_{min}$, or $1.05 \cdot U_{min}$. It is important to refresh frequently the estimate of the state-of-charge of the cells whose voltage is close to $U_{max}$ or on the other hand close to $U_{min}$. In fact, an error in the estimate of the cell's state-of-charge in such a situation may lead to a degradation of the electrical and mechanical properties of that cell.

Next, for the other cells, during a third prioritizing operation 204 the computer 44 calculates the difference in voltage between the present measured value $y_k$ and a previous value $y_{k-x}$, where X is a predetermined whole number greater than or equal to one and generally less than 5 or 10. Here, X=1.

During a fourth prioritizing operation 205, the computer 44 identifies twin cells. Cells are considered to be "twins" if, at the same time k, they have the same voltage difference and the same measured value $y_k$.

To identify such twin cells, the computer 44 compares the voltage difference and the measured value $y_k$ of one cell to the voltage differences and the measured values $y_k$ of the other cells at the same time. For those cells that are twins to a particular cell, the particular cell's identifier, as well as those of its twins, are grouped into a set. This set is then recorded in the memory 42.

In the embodiment described herein, the above comparison is carried out for each of the cells of the battery 10 whose identifier has not already been incorporated into one of the sets of twin cells so recorded. Once a group of cells has been identified as a set of twin cells, a priority level is assigned to only cell in that set. Thus, the fifth prioritizing operation 206 and the following scheduling step 208 and SOC-estimation step 210 are performed only for the cells not having any twin cell and for a single cell of each set of twin cell During a fifth prioritizing operation 206, the computer 44 sorts the cells in decreasing order of the absolute value of the difference calculated during the third prioritizing-operation 204. It then assigns, to the first cells of the resulting sorted list, any remaining places available for cells with elevated priority levels. It then assigns the remaining cells to any remaining places available for cells with medium priority level to the next cells in the sorted list. Finally, any remaining cells are assigned the lowest priority level.

Once a priority level has been assigned to each cell, the computer 44 carries out a scheduling step 208 during which it schedules times for refreshing the state of charge estimates for the various cells. This scheduling is carried out subject to the constraint that cells with higher priority levels must have their estimates refreshed more frequently than cells that have a lower priority level.

During the scheduling step 208, the computer 44 schedules the refresh times for estimating states-of-charge for the various cells as a function of their respective priority levels. The scheduling step 208 is carried out so as yield the correct estimation frequency for a cell based on that cell's priority level.

One way to schedule refresh times is to have the computer 44 reserve the times at which estimates of elevated-priority level cells need to be refreshed. Next, the computer 44 reserves the times at which cells of medium priority level need to have their state-of-charge estimates refreshed. In doing so, the computer 44 avoids scheduling conflicts with refresh times that have already been reserved. Finally, the computer repeats this procedure for those cells assigned a low priority level.

Figure 13:
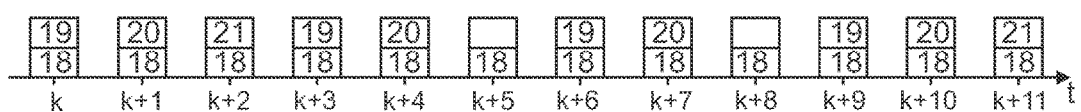
FIG. 13 is a flow chart illustrating different scheduled refresh times with the aid of the method of FIG. 12.

To illustrate this, assume that an elevated priority level has been assigned to the cell 18, a medium priority level has been assigned to the cells 19 and 20, and a low priority level has been assigned to the cell 21. Furthermore, assume that during a period $T_e$ the computer executes the SOC-estimation phase 114 of the method of FIG. 10 at most twice. The result obtained with these assumptions is represented in FIG. 13.

In this figure, the times k to k+11 have been plotted along the x-axis. Above each of these times k, two boxes symbolize the fact that the computer 44 may, at each time k, execute the SOC-estimation phase 114 of the method of FIG. 10 twice. In each of these boxes, the number of the cell for which the SOC-estimation phase 114 is executed has been indicated. When no number appears in this box, it means that the method of FIG. 10 was not executed. This means that the computer can be used for other purposes, such as, for example execution of the second and third estimators 66, 68.

Finally, during an SOC-estimation step 210, for each cell assigned a priority level the computer 44 executes the SOC-estimation phase 114 at the scheduled time for this cell. Outside of these scheduled times, the computer 44 inhibits the full execution of the SOC-estimation phase 114 for this cell. Likewise, the computer 44 also inhibits execution of the SOC-estimation phase 114 for the twin cells to which no priority level has been assigned.

In parallel, during a twin-suppression step 212, for each twin cell that has no priority level assigned to it, the state-of-charge estimate for that cell is set equal to the most recent state-of-charge estimate carried out for a twin cell of this cell. Thus, the SOC-estimation phase 114 is executed for only one of the twin cells in a set of twin cells. This makes it possible to reduce the computing power needed to determine the state-of-charge of the battery without degrading the estimate.

Optionally, in parallel with step 210, at each time k the computer 44 also executes an SOC-prediction step 214 during which it predicts the state-of-charge for each of the cells that were not processed during the SOC-estimation step 210 at time k. The SOC-prediction step 214 consists in executing only the SOC-prediction step 116, without executing the SOC-prediction correcting step 122, for all the cells for which at the same time the full estimate of the SOC-estimation phase 114 was not executed. In fact, the SOC-prediction step 116 imposes a much smaller computational load than the SOC-prediction correcting step 122 and thus it may be executed, for example, at each time k. Thus, when the SOC-prediction step 214 is carried out, one will have, at each time k, a new estimate of the state-of-charge for each of the cells of the battery.

The prioritizing step 198 and the scheduling step 208 are repeated at regular intervals in order to update the priority level assigned to each of these cells. This will update the refresh frequencies for estimating the states-of-charge of these cells. This method makes it possible to limit the computing computational load associated with such estimates without significantly degrading the estimate.

In fact, the method of FIG. 12 exploits the fact that the cells whose voltage differences are low are cells that are not discharged or charged very often, and therefore precisely those whose state-of-charge would not be expected to change rapidly.

During the execution of the methods of FIGS. 10 and 11, each time that the state-of-charge $SOC_k$ of a cell at a given time needs to be used for a calculation, the state-of-charge $SOC_k$ is set equal to the last state-of-charge estimated or predicted for this cell. In other words, it is considered that the state-of-charge remains constant between two successive times when it is estimated or predicted.

It will likewise be noted that, whenever the computer 44 executes the SOC-estimation phase 114 for a cell, it retrieves the necessary information for this execution from values obtained at the end of the previous execution of this phase for the same cell. This is the case in particular for the state variables, for example. It will be noted, however, that the time of previous execution is then not necessarily the time k−1, but it can be the time k−3 or k−10 depending on the priority level assigned to the cell.

Many other embodiments of the estimation method are possible.

For example, FIG. 14 represents another arrangement of estimators that is identical to that shown in FIG. 3 except that the second and third estimators 66, 68 are replaced by a single combined estimator 230. The combined estimator 230 simultaneously estimates the capacitance and the internal resistance of the cell 18. The combined estimator 230 is executed less frequently than the first estimator 60. The execution times of the combined estimator 230 are denoted as k4. The estimated capacitances and internal resistances are denoted $C_{n,k4}$ and $RO_{k4}$. The set of times k4 is a subset of the times k.

The combined estimator 230 estimates the capacitance $C_{n,k4}$ and the internal resistance $RO_{k4}$ at the same time. It does so by implementing a Kalman filter that uses a fourth state model 232 and a fourth observation model 234. These are shown in FIGS. 15 and 16 respectively.

FIG. 17 shows the operation of the combined estimator 230. This method of FIG. 17 is identical to that described in connection with FIG. 10 except that the first comparison step 130 and the capacitance-prediction correction step 174 have been replaced by a fourth comparison step 240, a second counting step 242, a fifth comparison step 244, and an estimation phase 246 for estimating capacitance and the internal resistance.

During the fourth comparison-step 240, the computer 44, at each time k, compares the measured value $y_k$ with an upper threshold $SH_{y2}$. Typically, the upper threshold $SH_{y2}$ is greater than or equal to $0.8 \cdot U_{max}$ or $0.9 \cdot U_{max}$. Only if the measured value $y_k$ drops below this threshold $SH_{y2}$ will the second counting step 242 and the fifth comparison step 244 actually execute.

During the second counting step 242, the computer 44 initializes a counter at zero and then increments this counter by 1 at each new time k. Moreover, at each of these times k the measured current $i_k$, the measured voltage $y_k$, the state-of-charge $SOC_k$, and the estimated voltage $V_{D,k}$ are recorded in a database and associated with this time k.

In parallel with the second counting step 242, at each time step k, the fifth comparison step 244 compares the new measured value $y_k$ to a lower voltage threshold $SL_{y2}$. This lower threshold $SL_{y2}$ is less than or equal to $1.2 \cdot U_{min}$ or $1.1 \cdot U_{min}$ and greater than or equal to $U_{min}$.

Once the measured value $y_k$ drops below the lower threshold $SL_{y2}$, the second counting step 242 stops incrementing the counter. The combined estimator 230 then begins execution. On the other hand, as long as the measured value $y_k$ remains above the lower threshold $SL_{y2}$, the combined estimator 230 never has to execute.

The combined estimator 230 executes an estimation phase 246. As before, the times $k_4$ and $k_4\_1$ are separated by an interval of time greater than or equal to $NT_e$, where N is the value of the counter as incremented during the second counting step 242. The functioning of the combined estimator 230 can be inferred from the functioning previously described second and third estimators 66, 68. Thus, it will not be described here in further detail.

Other circuit models and thus other state models can be used to estimate the cell's state-of-charge. Some practices omit the parallel RC circuit 54 from the circuit model. On the other hand, other practices use a more complex circuit model that has several parallel RC circuits electrically connected in series with each other. The state model of the cell 18 should thus be modified as a consequence in order to correspond to the new circuit model of the cell. However, all that has been described above applies with no difficulty to such a modified state model. Examples of modified state models are described in the patent application WO2006057468, the contents of which are herein incorporated by reference.

The parameters $R_D$ and $C_D$ of the circuit model 50 can also be estimated instead of being considered to be predetermined constant parameters. For this purpose, these two parameters $R_D$ and $C_D$ are introduced into the state vector $x_k$, which then becomes $[SOC_k, V_{D,k}, R_{D,k}$ and $C_{D,k}]^T$. In that case, the state model is modified to incorporate the following two equations $R_{D,k-1}=R_{D,k}$ and $C_{D,k+1}=C_{D,k}$.

In some embodiments, the cell's temperature is included in the state vector $x_k$. In such embodiments, the temperature is estimated concurrently with the state-of-charge.

Embodiments also include those in which the cell has one or more supplemental sensors to measure other physical quantities. This leads to modified observation models, examples of which are given in WO2006057468.

Other possible circuit models to simulate the electrical cell are also presented in part 2 of Plett 2004, in chapter 3.3.

The automatic continual adjustment of the covariance matrices $R_k$ and $Q_k$ can be done in a different way. One alternative method is covariance matching as described in Mehra, R. K: "On the identification of variances and adaptive Kalman Filtering," Automatic Control, IEEE Transaction on, Volume 15, No. 2, pages 175-184, April 1970. This method is applied after an initial setup of the matrices $R_0$ and $Q_0$, for example, as described during the first covariance-adjustment step 102.

In another practice, the matrices $Q_0$, $R_0$, $Q_k$ and $R_k$ are not adjusted as described in connection with the first covariance-adjustment step 102 and the covariance-updating step 120. Instead, these matrices are adjusted by carrying out a conventional method. In a simplified case, the matrices are constant. In some practices, the matrix $R_0$ is set up using data provided by the manufacturer of the sensors or based on tests performed on the sensors, and the matrix $Q_0$ is set up by consecutive tests.

Theory Algorithms and Software", Wiley Inter-science, 2001.

The SOC-prediction correcting step 122 or the second capacitance-prediction correction operation 178 for correction of the prediction can be done differently. For example, in one preferred method, the correction of the prediction of the state-of-charge and the voltage $V_{D,k}$ is done by minimizing a quadratic cost function J composed a first term that is linked to the error of prediction of the measured value, and a second term that is linked to the error of estimation of the state vector. This method is described in detail in chapter 10.5.2 of Y. Bar-Shalom, et al.: "Estimation With Applications to Tracking and Navigation, Theory Algorithms and Software," Wiley Inter-science, 2001

In another practice, the first estimator 60 is not implemented as Kalman filter. Instead, the state-of-charge is estimated by simulating its development over time using an infinite impulse response filter whose coefficients are estimated by the recursive least squares method.

Other models of state can be used to estimate the cell's internal resistance and capacitance. For example, in some embodiments, a fifth state model 250 replaces the fourth state model 232. The fifth state model 250, shown in FIG. 18, includes constants $\alpha$, $\beta$ and $\gamma$ whose values are obtained from cell manufacturer data or measured experimentally. Typically, $\alpha$ is equal to $1\pm30\%$ or $1\pm10\%$, $\beta$ is also equal to $1\pm30\%$ or $1\pm10\%$, and $\gamma$ is typically between 0.1 and 0.5. For example, $\gamma$ is equal to $0.2\pm30\%$ or $0.2\pm10\%$.

In the fifth state model 250, $N^c_k$ is equal to the number of charging/discharging cycles of the cell performed prior to the time k. This number of cycles is measured for example by counting the number of times that the state-of-charge of the cell drops below the upper threshold $SH_{soc}$ then below the lower threshold $SL_{soc}$. The noise term $w^a_{d,k}$ represents centered Gaussian white noise. The value of $\gamma$ is the difference, expressed as a percentage divided by 100, between the initial capacitance $C_n^{ini}$ of the cell and its end of life capacitance. This model accounts for the fact that, as a cell ages, its cell's internal resistance increases and its internal capacitance diminishes.

In a similar manner, the second state model 70 can be replaced by the state model: $RO_{k2+1}=(\alpha+\beta N^C_{k2}/N^C_{EOL})RO_{k2}+w_{2,k2}$, where the different symbols of this model have already been defined previously.

The third state model 74 can be replaced by the state model: $C_{n,k3+1}=(1-\gamma N^C_{k3}/N^C_{EOL})C_{n,k3}+v_{3,k3}$ where the different symbols of this model have already been defined previously.

Depending on the observation model used by the third estimator 68, the quantity $z_{k3}$ can be calculated differently. In some practices, $z_{k3}$ is equal to the sum of the last N currents measured between times k and k−N+1. In this case, when N is equal to 1, $z_{k3}=ik_3$.

What was described above for the initialization of the covariance matrices $Q_k$ and $R_k$ can also be applied to the initialization of the covariance matrices of the third estimator 68 and the combined estimator 230.

In alternative practices, the third estimator 68 is not implemented in the form of a Kalman filter. In one such alternative practice, the capacitance is estimated by simulating its development over time using an infinite impulse response filter whose coefficients are estimated by the recursive least squares method.

The methods of FIGS. 10 and 17 may be simplified by setting N to be equal to a predetermined constant. In this case, N is not counted. Therefore, it is possible to omit the second comparison step 160, the first counting step 162, the fourth comparison step 240, and the second counting step 242. For example, N is chosen equal to one or, on the other hand, absolutely greater than one, or five, or ten.

In another practice, at each time k between the times k3 and k3−1 only the capacitance-prediction step 170 of calculation of a prediction $C_{n,k}$ is executed, but capacitance-prediction correction step 174 of correction of this prediction is not executed. Thus, one obtains a new prediction of the capacitance of the cell at each of these times k while avoiding an excessive computational burden. In a similar fashion, at each time k between the times k4 and k4−1, only the step of calculating the predictions of the capacitance and the internal resistance is executed without executing the step of correcting these predictions. Thus, in these practices, the capacitance of the cell is predicted at each time k but this prediction is corrected only at the times k3 or k4. The algorithm for estimation of this capacitance is thus only partly executed between times k3 and k3−1 or k4 and k4−1 and fully executed only at time k3 or k4.

At each time k between times k3 and k3−1 or between times k4 and k4−1, the capacitance can be estimated by executing a first algorithm. Then at time k3 or k4 the capacitance is estimated by executing a second algorithm that is different from the first algorithm and that imposes a greater computational load. The first and second algorithms do not necessarily correspond, as described above, to respectively the capacitance-prediction step 170 and the estimation phases 166, 246 of a Kalman filter. They may also be two completely different estimation algorithms.

The capacitance-estimation phase 166 or the estimation phase 246 can also be triggered in response the state-of-charge crossing a threshold of-charge, as described in connection with FIG. 10. Alternatively, it can be trigged in response to the voltage crossing a threshold as described in connection with FIG. 17.

In some practices, the estimation phases 166, 246 are triggered in response to current crossing a threshold. To execute this procedure, starting with the time at which the voltage or the state-of-charge of the cell has dropped below a predetermined upper threshold, at each time k the computer 44 calculates the accumulated charge transferred $QC_k$ with the help of the relationship $QC_k = QC_{k-1} + ikT_e$. Once the accumulated charge $QC_k$ crosses an upper threshold $SH_Q$, the computer 44 executes the estimation phases 166, 246. On the other hand, as long as the accumulated charge $QC_k$ remains above the threshold $SH_Q$, the computer 44 continues to inhibit execution of the estimation phases 166, 246. In an alternative practice, the quantity $QC_k$ may also be calculated on a sliding window containing the last N times k, where N is a predetermined constant.

Other practices omit triggering estimation of capacitance and/or the internal resistance in response to crossing of a threshold. Among these are practices that trigger these estimation steps at regular intervals. In cases where sufficient computational capacity is available, the regular interval is equal to $T_e$.

Other practices of the method of FIG. 12 omit the fourth prioritizing operation 205. In such cases, no twin cell is identified. Therefore, the twin-suppression step 212 is also omitted.

Other practices either carry out the second prioritizing operation 202 differently or omit it altogether. Among the former are practices in which only a single one of the upper and lower thresholds is used. In other practices, the second prioritizing operation 202 is omitted altogether.

Although two priority levels are necessary, any number beyond that is arbitrary.

Other methods for assigning a priority level to the cells are possible. For example, in some practices, the priority level of a cell may be calculated with the help of a formula linking its priority level to its voltage difference and its voltage. In these practices, the comparison operations are omitted.

The method described for associating the refresh times with the cells as a function of their priority levels is only one example. Any other known method for ordering tasks as a function of the priority level of these tasks can be adapted to ordering of the refresh times for estimating states-of-charge of the cells.

The scheduling of the refresh times for the estimation of the state-of-charge of each of the cells as described in regard to FIG. 12 may be omitted. For example, this will be the case if the computing power needed for the estimation of the state-of-charge of each of the cells at each time k is available.

In an alternative practice, the computer 44 comprises several programmable sub computers each of them able to execute in parallel the method of estimation of FIG. 10 or 17 for respective cells.

Alternative practices calculate the cell's state-of-health of a cell using a ratio of resistances, such as $SOH_k = RO_k / RO^{ini}$.

Many kinds of battery 10 are possible, including a lead battery, a super capacitance, or a fuel cell. In such case, the state model and/or the observation model of the first estimator 60 are optionally adapted to accommodate the peculiarities of the relevant battery technology.

What has been specified above also applies to a hybrid vehicle, that is, the vehicle whose driving of the powered wheels is provided at the same time, or alternately, by an electric motor and a thermal internal combustion engine. The vehicle 2 can be a truck, a motorbike or a tricycle or, generally speaking, any vehicle capable of moving by driving the power wheels with the aid of an electric motor energized by a battery. For example, it may be a hoist.

The battery 10 can be recharged with the aid of an electrical outlet which allows it to be electrically connected to the electricity mains. The battery 10 can also be recharged by a thermal internal combustion engine.

Having described the invention, and a preferred embodiment thereof, what we claim as new, and secured by letters patent is:

1. A method comprising automatically estimating state-of-charge of a battery's cell, wherein automatically estimating state-of-charge comprises, at each instant k of a plurality of instants, acquiring a measured voltage $y_k$ and a measured current ik at an instant k, wherein said measured voltage $y_k$, is a voltage across said cell's terminals, and wherein said measured current ik is a current selected from the group consisting of a current that charges said cell and a current that discharges said cell, using a state model, and calculating, at said instant k, a prediction of said cell's state-of-charge $SOC_k$, wherein said state model relates said prediction to a product $F_k \cdot SOC_{k-1}$ and to a parameter measured at a preceding instant k−1 that precedes said instant, wherein said product is a product of said cell's state-of-charge $SOC_{k-1}$ at said preceding instant k−1 and a state transition matrix $F_k$ at said instant k, wherein said prediction is corrupted by state noise that is characterized by a state-noise covariance matrix $Q_k$, and wherein said parameter that is measured at a preceding instant k−1 is selected from the group consisting of said measured voltage and said measured current, wherein automatically estimating state-of-charge further comprises predicting a covariance of an error in said prediction based at least in part on said state-noise covariance matrix $Q_{k-1}$ at said preceding instant k−1 and a measurement-noise covariance matrix $R_{k-1}$ at said preceding instant k−1, calculating a prediction $\hat{y}_k$ of said measured voltage $y_k$ at said instant k using an observation model that relates said measured voltage $y_k$ to a product $H_k \cdot SOC_k$ of an observability matrix $H_k$ at said instant k and said prediction of said cell's state-of-charge at said instant k, wherein said prediction of said measured voltage $\hat{y}_k$ is corrupted with measurement noise that is characterized by said measurement noise-covariance matrix at said instant k, and correcting said prediction of said state-of-charge $SOC_k$ based at least in part on a difference between said measured voltage $y_k$ and said prediction $\hat{y}_k$ of said measured voltage $y_k$, wherein automatically estimating said state-of-charge further comprises setting said state-noise covariance matrix $Q_k$ using the relationship $Q_k=[N_0 G_{0,k}(N_0)]^{-1}$ and setting said measurement-noise covariance matrix $R_k$ to be the identity matrix, wherein $N_0$ is a pre-set integer that is greater than unity, and wherein $G_{0,k}(N_0)$ is given by $$G_{o,k}(N_o) = \sum_{i=0}^{N_o-1} (F_k^T)^i H_k^T H_k (F_k)^i.$$

2. The method of claim 1, further comprising detecting that a matrix has been modified and, in response to detecting that said matrix has been modified, setting said state-noise covariance matrix and setting said measurement-noise covariance matrix, wherein said matrix that has been modified is selected from the group consisting of said state-transition matrix $F_k$ and said observability matrix $H_k$.

3. The method of claim 1, further comprising constructing said observability matrix $H_k$ by linearizing a non-linear observability function that relates said measured value $y_k$ at said instant k to a predicted state-of-charge of said cell at said first instant.

4. The method of claim 3, further comprising selecting said non-linear observability function to be $OCV(SOC_k) + V_{D,k} + RO_{k2} \cdot i_k$, wherein $OCV(SOC_k)$ is a known non-linear function that expresses said cell's open-circuit voltage as a function of said cell's state-of-charge, wherein said cell's open-circuit voltage is a voltage across said cell's terminals when said cell's terminals have been electrically isolated from any electrical load for at least two hours, wherein a circuit model of said cell includes a parallel RC circuit that comprises a resistor $R_D$ and a capacitor $C_D$ connected in parallel, wherein $V_{D,k}$ is a voltage across terminals of said parallel RC wherein the resistance of said resistor $R_D$ and the capacitance of said capacitor $C_D$ are parameters of said cell, and wherein $RO_{k2}$ is said cell's internal resistance.

5. The method of claim 1, wherein a circuit model of said cell includes a parallel RC circuit that comprises a resistor $R_D$ and a capacitor $C_D$ connected in parallel, and wherein automatically estimating state-of-charge further comprises selecting said state model used to predict said cell's state-of-charge to be given by $$x_{k+1} = \begin{bmatrix} SOC_{k+1} \\ V_{D,k+1} \end{bmatrix} = \begin{bmatrix} 1 & 0 \\ 0 & 1 - \dfrac{Te}{R_D \cdot C_D} \end{bmatrix} \cdot \begin{bmatrix} SOC_k \\ V_{D,k} \end{bmatrix} + \begin{bmatrix} -\dfrac{Te}{C_{n,k}} \\ \dfrac{Te}{C_D} \end{bmatrix} \cdot i_k + w_k$$

wherein $V_{D,k+1}$ and $V_{D,k}$ are voltages across terminals of said parallel RC circuit at two instants, wherein $R_D$ is a resistance of said resistor $R_D$ and $C_D$ is a capacitance of said capacitor $C_D$ are said resistor and capacitor, wherein $T_e$ is a period of time that separates any two immediately successive instants k and k−1 of calculating said prediction of said cell's state-of-charge, wherein $C_{n,k}$ is said cell's capacitance, wherein said cell's capacitance is indicative of said cell's maximum capacity to store electrical energy, and wherein $W_k$ is a centered Gaussian white state noise, the covariance matrix of which is said state-noise covariance matrix $Q_k$.

6. An apparatus comprising a battery-management system for managing a battery equipped with at least one cell, wherein said battery-management system comprises a processor configured to execute said method of claim 1.

7. The apparatus of claim 6, further comprising a motor vehicle comprising a drive wheel, an electrical motor, a battery, a voltmeter, and an ammeter, wherein said electric motor is configured to rotate said drive wheel to move said motor vehicle, wherein said battery including at least one cell able to store electrical energy and, in alternation, release said electrical energy to power said electrical motor, said cell including two terminals with which said cell is electrically connected to said electrical motor, wherein said voltmeter is electrically connected between said two terminals of said cell in order to measure a voltage across said two terminals, wherein said ammeter is connected in series with said electrical cell, in order to measure a current that charges or discharges said cell, and wherein said battery-management system is electrically connected to said voltmeter and to said ammeter.

8. A manufacture comprising a non-transitory and tangible computer-readable medium having encoded thereon instructions for causing an electronic processor to execute said method recited in claim 1.

* * * * *